United States Patent
Liu et al.

(10) Patent No.: US 6,869,837 B1
(45) Date of Patent: Mar. 22, 2005

(54) METHODS OF FABRICATING A WORD-LINE SPACER FOR WIDE OVER-ETCHING WINDOW ON OUTSIDE DIAMETER (OD) AND STRONG FENCE

(75) Inventors: Yuan-Hung Liu, Shin-Chu (TW); Yeur-Luen Tu, Taichung (TW); Chin-Ta Wu, Hsinchu (TW); Tsung-Hsun Huang, Taipei (TW); Hsiu Ouyang, Taipei (TW); Chi-Hsin Lo, Jhubei (TW); Chia-Shiung Tsai, Hsin-Chu (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 0 days.

(21) Appl. No.: 10/758,316

(22) Filed: Jan. 15, 2004

(51) Int. Cl.[7] ...................... H01L 21/8238; H01L 29/76
(52) U.S. Cl. ........................................ 438/201; 257/314
(58) Field of Search ................................. 438/201, 211, 438/257, 259, 264; 257/314, 315, 317

(56) References Cited

U.S. PATENT DOCUMENTS

| | | | |
|---|---|---|---|
| 5,084,406 A | 1/1992 | Rhodes et al. ................. | 437/52 |
| 6,242,309 B1 * | 6/2001 | Lee ............................. | 438/266 |
| 6,599,797 B1 | 7/2003 | Hofmann et al. ........... | 438/248 |
| 2004/0077144 A1 * | 4/2004 | Hsieh ......................... | 438/257 |

* cited by examiner

Primary Examiner—Craig A. Thompson
(74) Attorney, Agent, or Firm—Thomas, Kayden, Horstemeyer & Risley

(57) ABSTRACT

A method of fabricating word-line spacers comprising the following steps. A substrate having an inchoate split-gate flash memory structure formed thereover is provided. A conductive layer is formed over the substrate and the inchoate split-gate flash memory structure. The conductive layer having: a upper portion and lower vertical portions over the inchoate split-gate flash memory structure; and lower horizontal portions over the substrate. A dual-thickness oxide layer is formed over the conductive layer and has a greater thickness over the upper portion of the conductive layer. The oxide layer is partially etched back to remove at least the oxide layer from over the lower horizontal portions of the conductive layer to expose the underlying portions of the conductive layer. Then etching: away the exposed portions of the conductive layer over the substrate; and through at least a portion of the thinned oxide layer and into the exposed underlying portion of the conductive layer to expose a portion of the inchoate split-gate flash memory structure and to form the word-line spacers adjacent the inchoate split-gate flash memory structure.

39 Claims, 4 Drawing Sheets

FINAL STRUCTURE COMMON TO BOTH EMBODIMENTS

*INITIAL STRUCTURE COMMON TO BOTH EMBODIMENTS*

*FIRST EMBODIMENT*

SECOND EMBODIMENT

FINAL STRUCTURE COMMON TO BOTH EMBODIMENTS

METHODS OF FABRICATING A WORD-LINE SPACER FOR WIDE OVER-ETCHING WINDOW ON OUTSIDE DIAMETER (OD) AND STRONG FENCE

FIELD OF THE INVENTION

Thee present invention relates generally to semiconductor devices and more specifically to split gate flash memory devices.

BACKGROUND OF THE INVENTION

Some flash memory employs an oxide liner to achieve a square profile of its word-line spacer although a fence is formed as a consequence of this method. In order to sustain a higher word-line spacer (for better formation of LDD spacers) and a strong fence (to prevent collapse) it necessary to have less oxide break-through and poly over-etch time which then causes a serious word line bridge issue and particle issues.

In the prior art, the serious bridge issue of the word-line spacers occurs due to insufficient over-etching or producing a weak fence at the side wall of the poly spacer during the break-through etch step.

U.S. Pat. No. 6,599,797 B1 to Hofmann et al. discloses and SOI DRAM without a floating body effect.

U.S. Pat. No. 5,084,406 to Rhodes et al. discloses a method for forming low resistance DRAM digit-line.

SUMMARY OF THE INVENTION

Accordingly, it is an object of one or more embodiments of the present invention to provide an improved method of fabricating word-line spacers for split gate flash memory devices.

Other objects will appear hereinafter.

It has now been discovered that the above and other objects of the present invention may be accomplished in the following manner. Specifically, a substrate having an inchoate split-gate flash memory structure formed thereover is provided. A conductive layer is formed over the substrate and the inchoate split-gate flash memory structure. The conductive layer having: a upper portion and lower vertical portions over the inchoate split-gate flash memory structure; and lower horizontal portions over the substrate. A dual-thickness oxide layer is formed over the conductive layer and has a greater thickness over the upper portion of the conductive layer. The oxide layer is partially etched back to remove at least the oxide layer from over the lower horizontal portions of the conductive layer to expose the underlying portions of the conductive layer. Then etching: away the exposed portions of the conductive layer over the substrate; and through at least a portion of the thinned oxide layer and into the exposed underlying portion of the conductive layer to expose a portion of the inchoate split-gate flash memory structure and to form the word-line spacers adjacent the inchoate split-gate flash memory structure.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIGS. 1 and 6 to 8 schematically illustrate a second preferred embodiment of the present invention.

DETAILED DESCRIPTION OF THE PREFERRED EMBODIMENT

Figure 1:
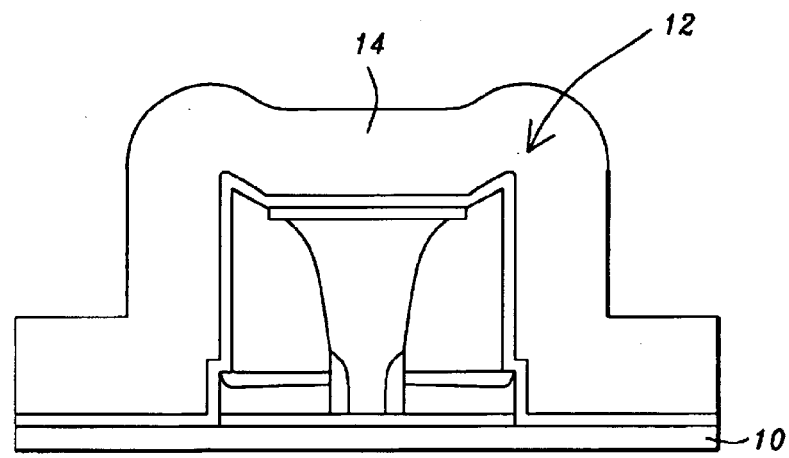
FIGS. 1 to 5 and 8 schematically illustrate a first preferred embodiment of the present invention.

Initial Structure Common to Both Embodiments—FIG. 1

FIG. 1 illustrates an inchoate split-gate flash memory structure 12 formed over a substrate 10 common to both embodiments of the present invention that includes a conductive layer 14 formed thereover. Conductive layer 14 is preferably comprised of polysilicon as will be used hereafter for purposes of illustration.

Polysilicon layer 14 has a thickness of preferably from about 1000 to 2000 Å, more preferably from about 1250 to 1850 Å and more preferably about 1800 Å.

Substrate 10 is preferably a silicon substrate or a germanium substrate and is more preferably a silicon substrate.

In the first embodiment, the thickness ratio of upper portion to underlying portion oxide layer may be enlarged with increasing implantation dosage. The ratio could be 1.5 or above. In the second embodiment, the machine limitation leads the ratio only 1.7 or below.

First Embodiment (Implantation of the Upper Portion 15 of Polysilicon Layer 14)—FIGS. 2 to 5 and 8

Figure 2:
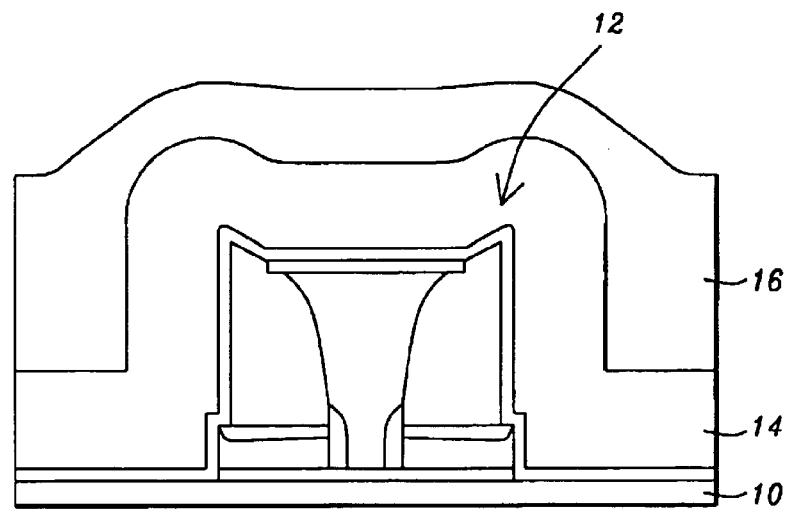

Formation of Dielectric Layer 16—FIG. 2

As shown in FIG. 2, a dielectric layer 16 is formed over the polysilicon layer 14 of FIG. 1. Dielectric layer 16 is preferably a bottom anti-reflective coating (BARC), a photoresist (PR) layer or a spin-on-glass (SOG) layer and is more preferably a bottom anti-reflective coating (BARC). Dielectric layer 16 has a thickness of preferably from about 2200 to 5000 Å, more preferably from about 2500 to 4000 Å and most preferably about 3000 Å.

Figure 3:
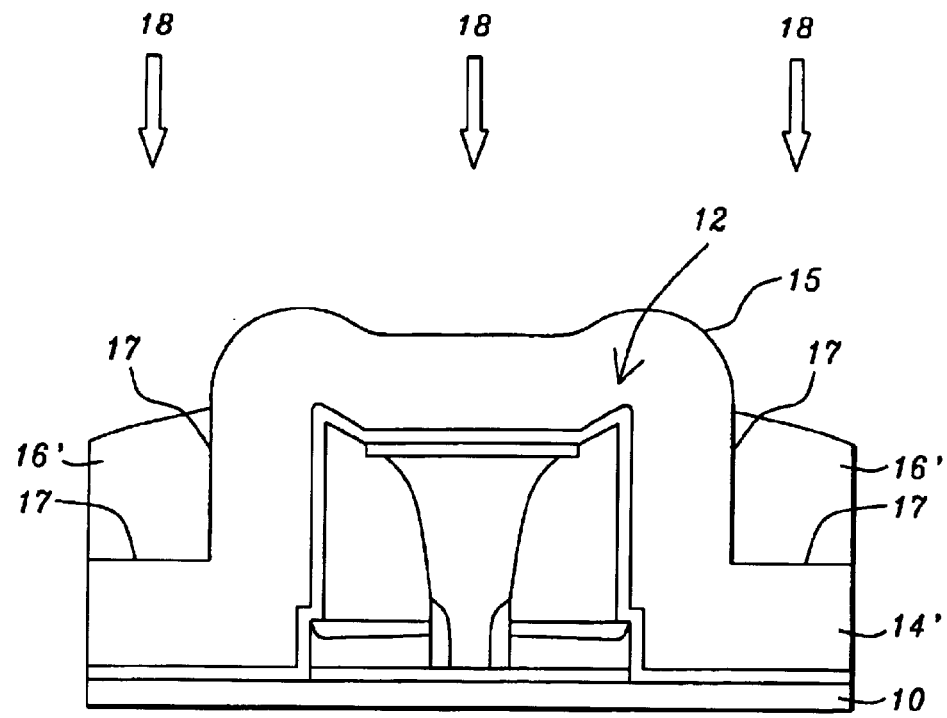

Partial Etch-Back of Dielectric Layer 16—FIG. 3

As shown in FIG. 3, dielectric layer 16 is partially etched back to expose the upper portion 15 of polysilicon layer 14 but leaving the bottom portion of polysilicon layer 14 covered. Dielectric layer 16 is preferably etched back using a plasma etch process or a sulfuric peroxide mixture (SPM) wet bench process or and more preferably using a plasma etch process under the following conditions: about 500 sccm $O_2$; and about 800 W RF.

Implanting of Exposed Portion 15 of Polysilicon Layer 14—FIG. 3

As also shown in FIG. 3, an implant 18 is then performed into the exposed portion 15 of polysilicon layer 14 at:

a dosage of preferably from about 1E14 to 5E15 atoms/$cm^2$ and more preferably from about 1E15 to 5E15 atoms/$cm^2$;

to a depth of preferably from about 500 to 2000 Å and more preferably from about 600 to 1200 Å; and preferably using As atoms or P atoms and more preferably using As atoms.

This leaves portions 17 of partially implanted polysilicon layer 14' unimplanted.

The remaining etched-back dielectric layer 16' is removed to expose the implanted polysilicon layer 14' and the structure is cleaned as necessary. The remaining etched-back dielectric layer 16' is preferably removed using a plasma etch process or a sulfuric peroxide mixture (SPM) wet bench process and more preferably by a plasma etch process.

Figure 4:
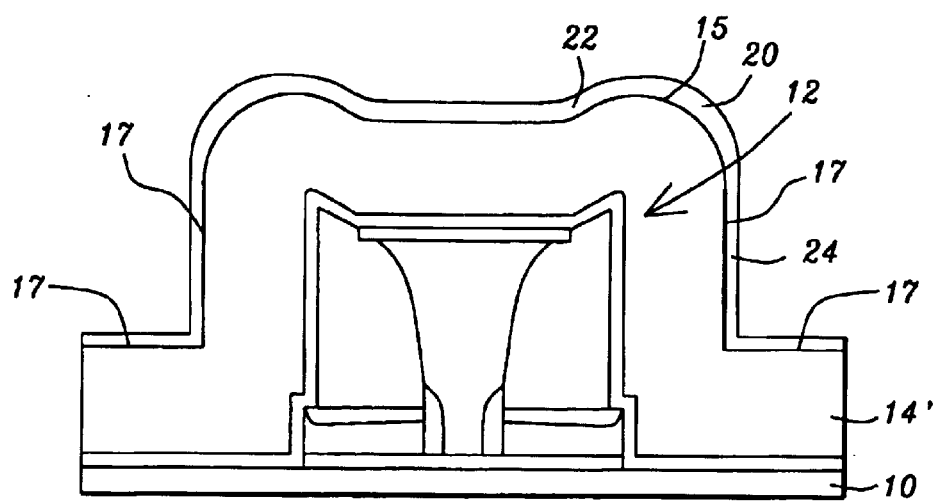

Growth of Thermal Oxide Layer 20—FIG. 4

As shown in FIG. 4, an oxide layer 20 is thermally grown over the now exposed partially implanted polysilicon layer 14'. Thermal oxide layer 20 will have a portion 22 of greater thickness over the implanted upper portion 15 of partially implanted polysilicon layer 14' and will have portions 24 of lesser thickness over the non-implanted lower portions 17. Specifically, thermal oxide layer 20 will have a thickness of preferably from about 200 to 2000 Å, more preferably from about 400 to 600 Å and most preferably about 500 Å over the implanted upper portion 15 and from about 100 to 500 Å, more preferably from about 200 to 400 Å and most preferably about 250 Å over the implanted lower portions 17.

Figure 5:
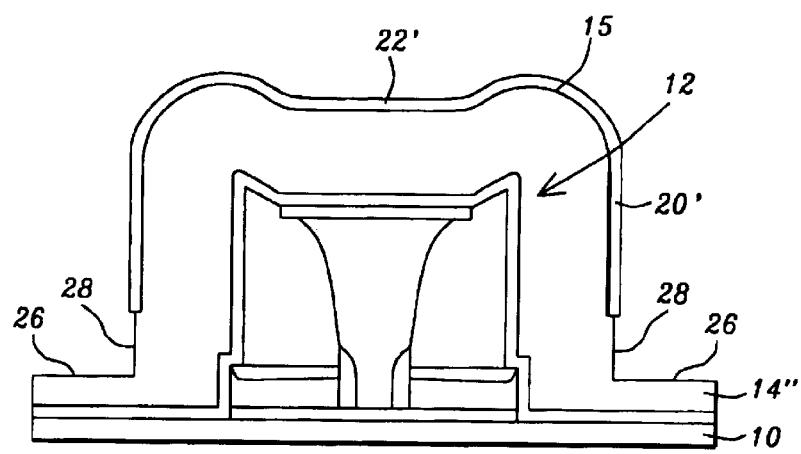

Partial Etch-Back of Thermal Oxide Layer 20—FIG. 5

As shown in FIG. 5, thermal oxide layer 20, and the lower horizontal portions of partially non-implanted polysilicon layer 14', are partially etched-back to expose lower vertical portions 28 and lower, partially etched-back horizontal portions 26 of partially etched back, partially non-implanted polysilicon layer 14". This thins at least the thicker portion 22 of thermal oxide layer 20 to form thinner portion 22' of partially etched-back thermal oxide layer 20' having a thickness of preferably from about 50 to 500 Å, more preferably from about 100 to 350 Å and most preferably about 120 Å. The lower, partially etched-back horizontal portions 26 of partially etched back, partially non-implanted polysilicon layer 14" each have a thickness of preferably from about 300 to 800 Å, more preferably from about 500 to 700 Å and most preferably about 600 Å.

Figure 8:
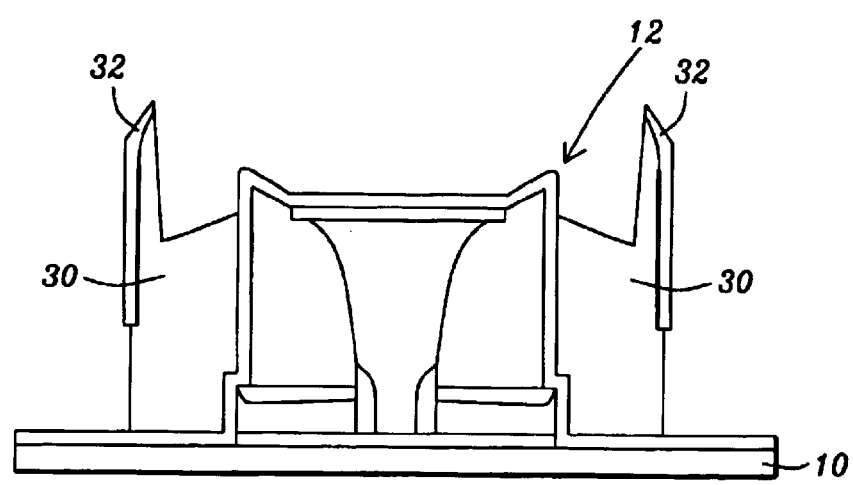

Etching of Partially Etched-Back, Partially Implanted Polysilicon Layer 14"—FIG. 8

As shown in FIG. 8, the horizontal portions of partially etched-back thermal oxide layer 20' are completely etched through and then the partially etched-back, partially implanted polysilicon layer 14" is etched, preferably using an anisotropic plasma etch process, to form the final split-gate flash memory structure 12 having word-line polysilicon spacers 30 with a square profile.

Word-line polysilicon spacers 30 have a width 31 substantially equal to the thickness of formed polysilicon layer 14, i.e. a width of preferably from about 1700 to 1900 Å, more preferably from about 1750 to 1850 Å and more preferably about 1800 Å.

It is noted that remnants 32 of partially etched-back thermal oxide layer 20' remain over the upper, outer side walls of word-line polysilicon spacers 30.

It is also noted that the final structure as shown in FIG. 8, is the same structure for the second embodiment as well as this first embodiment.

Further processing may then proceed.

Figure 6:
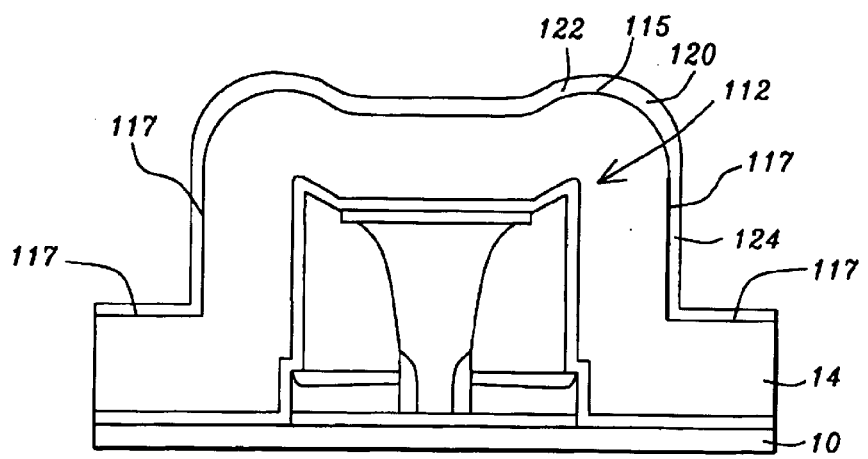
Figure 7:
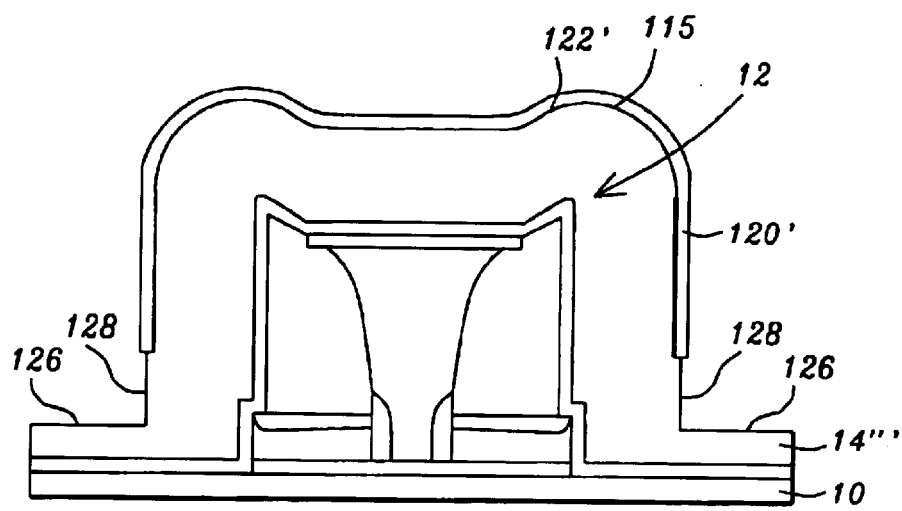

Second Embodiment (Formation of Poor-Step-Coverage RPO Film 122 Over Polysilicon Layer 14)—FIGS. 6 to 8

Formation of Poor-Step-Coverage Oxide Layer 120—FIG. 6

As shown in FIG. 6, an oxide layer 120 having poor-step-coverage is formed over the polysilicon layer 14 of FIG. 1. Oxide layer 120 is preferably a resist protect oxide (RPO) or low deposition rate (LDR) oxide and more preferably a resist protect oxide (RPO).

Because oxide film 120 is formed having poor step coverage, it will overhang at the top corners of polysilicon layer 14 and will have a portion 122 of greater thickness over the upper portion 115 of polysilicon layer 114 and will have portions 124 of lesser thickness over the lower vertical and horizontal portions 117 of polysilicon layer 114.

Specifically, upper oxide layer portion 122 has a thickness of preferably from about 300 to 700 Å, more preferably from about 390 to 610 Å and most preferably about 500 Å over the upper portion 115 of polysilicon layer 114 and lower oxide layer portions 124 will each have a thickness of preferably from about 180 to 420 Å, more preferably from about 250 to 350 Å and most preferably about 300 Å over the lower portions 117 of polysilicon layer 114.

It is noted that the structure shown in FIG. 6 in this second embodiment is substantially equal to the structure shown in FIG. 4 in the previously described first embodiment. The process key is the deviation between the upper portion 20/22, 120/122 and the underlying portion oxide layer 14.

Partial Etch-Back of Poor-Step-Coverage Oxide Layer 120—FIG. 7

As shown in FIG. 7, poor-step-coverage oxide layer 120, and the lower horizontal portions of polysilicon layer 114, are partially etched-back to expose lower vertical portions 128 and lower, partially etched-back horizontal portions 126 of partially etched back polysilicon layer 114'''. This thins at least the thicker portion 122 of poor-step-coverage oxide layer 120 to form thinner portion 122' of partially etched-back poor-step-coverage oxide layer 120' having a thickness of preferably from about 50 to 200 Å, more preferably from about 100 to 150 Å and most preferably about 120 Å. The lower, partially etched-back horizontal portions 126 of partially etched back polysilicon layer 14''' each have a thickness of preferably from about 300 to 800 Å, more preferably from about 500 to 700 Å and most preferably about 600 Å.

Etching of Partially Etched-Back Polysilicon Layer 14'''—FIG. 8

As shown in FIG. 8, the horizontal portions of partially etched-back poor-step-coverage oxide layer 120' are completely etched through and then the partially etched-back polysilicon layer 14''' is etched, preferably using an anisotropic plasma etch process, to form the final split-gate flash memory structure 12 having word-line polysilicon spacers 30 with a square profile.

Word-line polysilicon spacers 30 have a width substantially equal to the thickness of formed polysilicon layer 14, i.e. a width of preferably from about 1700 to 1900 Å, more preferably from about 1750 to 1850 Å and more preferably about 1800 Å.

It is noted that remnants 32 of partially etched-back poor-step-coverage oxide layer 120' remain over the upper, outer side walls of word-line polysilicon spacers 30.

It is also noted that the final structure as shown in FIG. 8, is the same structure for the first embodiment as well as this second embodiment.

Further processing may then proceed.

Advantages of the Present Invention

The advantages of one or more embodiments of the present invention include:

1. wide OE window to substrate is led by pre-recessing underlying portion of the polysilicon layer;
2. stronger fence is formed to avoid particle issue with lower oxide breakthrough over etch ratio; and
3. more word-line spacer height is formed to avoid bridge issue, word-line to active area in the following cobalt silicide process, by lower over etch ratio on upper portion of the polysilicon layer.

While particular embodiments of the present invention have been illustrated and described, it is not intended to limit the invention, except as defined by the following claims.

We claim:

1. A method of fabricating word-line spacers, comprising the steps:
    a) providing a substrate having an inchoate split-gate flash memory structure formed thereover;
    b) forming a conductive layer over the substrate and the inchoate split-gate flash memory structure; the conductive layer having a upper portion and lower vertical portions over the inchoate split-gate flash memory structure and lower horizontal portions over the substrate;

c) forming a dual-thickness oxide layer over the conductive layer; the dual-thickness oxide layer having a greater thickness over the upper portion of the conductive layer;

d) partially etching-back the oxide layer to remove at least the oxide layer from over the lower horizontal portions of the conductive layer to expose the underlying portions of the conductive layer; and e) etching:
  i) away the exposed portions of the conductive layer over the substrate; and
  ii) through at least a portion of the thinned oxide layer and into the exposed underlying portion of the conductive layer to expose a portion of the inchoate split-gate flash memory structure and to form the word-line spacers adjacent the inchoate split-gate flash memory structure.

2. The method of claim 1, wherein the substrate is a silicon substrate or a germanium substrate.

3. The method of claim 1, wherein the conductive layer has a thickness of from about 1000 to 2000 Å and the word-line spacers each have a thickness of from about 1700 to 1900 Å.

4. The method of claim 1, wherein the conductive layer has a thickness of from about 1250 to 1850 Å and the word-line spacers each have a thickness of from about 1750 to 1850 Å.

5. The method of claim 1, wherein the conductive layer has a thickness of about 1800 Å and the word-line spacers each have a thickness of about 1800 Å.

6. The method of claim 1, wherein the word-line spacers include upper and lower outer side walls and remnants of the thinned oxide layer remain over the upper, outer side walls of word-line spacers.

7. The method of claim 1, wherein the upper portion of the conductive layer is implanted and the dual-thickness oxide layer is thermally grown over the conductive layer.

8. The method of claim 1, including the steps of:
  masking the polysilicon layer to expose the upper portion of the conductive layer before formation of the dual-thickness oxide layer; and
  then implanting the exposed upper portion of the conductive layer;
wherein the dual-thickness oxide layer is thermally grown over the partially non-implanted conductive layer.

9. The method of claim 1, wherein the portion of the dual-thickness oxide layer having a greater thickness has a thickness of from about 200 to 2000 Å and the remainder of the dual-thickness oxide layer has a thickness of from about 100 to 500 Å.

10. The method of claim 1, wherein the portion of the dual-thickness oxide layer having a greater thickness has a thickness of from about 400 to 600 Å and the remainder of the dual-thickness oxide layer has a thickness of from about 200 to 400 Å.

11. The method of claim 1, wherein the portion of the dual-thickness oxide layer having a greater thickness has a thickness of about 500 Å and the remainder of the dual-thickness oxide layer has a thickness of about 250 Å.

12. The method of claim 1, wherein the dual-thickness oxide layer is formed having a poor step coverage.

13. The method of claim 1, wherein the portion of the dual-thickness oxide layer having a greater thickness has a thickness of from about 300 to 700 Å and the remainder of the dual-thickness oxide layer has a thickness of from about 180 to 420 Å.

14. The method of claim 1, wherein the portion of the dual-thickness oxide layer having a greater thickness has a thickness of from about 390 to 610 Å and the remainder of the dual-thickness oxide layer has a thickness of from about 250 to 350 Å.

15. The method of claim 1, wherein the portion of the dual-thickness oxide layer having a greater thickness has a thickness of about 500 Å and the remainder of the dual-thickness oxide layer has a thickness of about 300 Å.

16. The method of claim 1, wherein the conductive layer is comprised of polysilicon.

17. The method of claim 1, wherein the partial etching-back of the oxide layer also thins the oxide layer having a greater thickness over the upper portion of the conductive layer.

18. A method of fabricating word-line spacers, comprising the steps:
  a) providing a substrate having an inchoate split-gate flash memory structure formed thereover;
  b) forming a polysilicon layer over the substrate and the inchoate split-gate flash memory structure; the polysilicon layer having a first upper portion and lower vertical portions over the inchoate split-gate flash memory structure and lower horizontal portions over the substrate;
  c) forming an oxide layer over the polysilicon layer; the oxide layer having:
    i) a first portion over the first upper portion of the polysilicon layer; the first oxide layer portion having a first thickness; and
    ii) second portions over the lower vertical and horizontal portions of the polysilicon layer; the second oxide layer portions each having a second thickness that is less than the first thickness;
  d) partially etching-back the oxide layer to:
    i) thin the first oxide layer portion over the first upper portion of the polysilicon layer;
    ii) remove the horizontal second oxide layer portions from over the lower horizontal portions of the polysilicon layer to expose the horizontal portions of the polysilicon layer over the substrate; and
    iii) remove portions of the vertical second oxide layer portions from over the lower vertical portions of the polysilicon layer to expose vertical portions of the polysilicon layer contiguous with the exposed horizontal portions of the polysilicon layer; and
  e) etching:
    i) through the horizontal thinned first oxide layer portion to expose a second upper portion of the polysilicon layer thereunder;
    ii) away the exposed horizontal portions of the polysilicon layer over the substrate; and
    iii) the second upper portion of the polysilicon layer to remove the polysilicon layer over the inchoate split-gate flash memory structure and partially remove the polysilicon layer adjacent the inchoate split-gate flash memory structure to form the word-line spacers.

19. The method of claim 18, wherein the substrate is a silicon substrate or a germanium substrate.

20. The method of claim 18, wherein polysilicon layer has a thickness of from about 1000 to 2000 Å and the word-line spacers each have a thickness of from about 1700 to 1900 Å.

21. The method of claim 18, wherein polysilicon layer has a thickness of from about 1250 to 1850 Å and the word-line spacers each have a thickness of from about 1750 to 1850 Å.

22. The method of claim 18, wherein polysilicon layer has a thickness of about 1800 Å and the word-line spacers each have a thickness of about 1800 Å.

23. The method of claim 18, wherein the word-line spacers include upper and lower outer side walls and remnants of the thinned oxide layer remain over the upper, outer side walls of word-line spacers.

24. The method of claim 18, wherein the upper portion of the polysilicon layer is implanted and the dual-thickness oxide layer is thermally grown over the polysilicon layer.

25. The method of claim 18, including the steps of:
   masking the polysilicon layer to expose the upper portion of the polysilicon layer before formation of the dual-thickness oxide layer; and
   then implanting the exposed upper portion of the polysilicon layer; wherein the dual-thickness oxide layer is thermally grown over the partially non-implanted polysilicon layer.

26. The method of claim 18, wherein the portion of the dual-thickness oxide layer having a greater thickness has a thickness of from about 200 to 2000 Å and the remainder of the dual-thickness oxide layer has a thickness of from about 100 to 500 Å.

27. The method of claim 18, wherein the portion of the dual-thickness oxide layer having a greater thickness has a thickness of from about 400 to 600 Å and the remainder of the dual-thickness oxide layer has a thickness of from about 200 to 400 Å.

28. The method of claim 18, wherein the portion of the dual-thickness oxide layer having a greater thickness has a thickness of about 500 Å and the remainder of the dual-thickness oxide layer has a thickness of about 250 Å.

29. The method of claim 18, wherein the dual-thickness oxide layer is formed having a poor step coverage.

30. The method of claim 18, wherein the portion of the dual-thickness oxide layer having a greater thickness has a thickness of from about 300 to 700 Å and the remainder of the dual-thickness oxide layer has a thickness of from about 180 to 420 Å.

31. The method of claim 18, wherein the portion of the dual-thickness oxide layer having a greater thickness has a thickness of from about 390 to 610 Å and the remainder of the dual-thickness oxide layer has a thickness of from about 250 to 350 Å.

32. The method of claim 18, wherein the portion of the dual-thickness oxide layer having a greater thickness has a thickness of about 500 Å and the remainder of the dual-thickness oxide layer has a thickness of about 300 Å.

33. A split-gate flash memory structure, comprising:
   an inchoate split-gate flash memory structure (12) having outer vertical surfaces; and
   word-line spacers (30) adjacent the vertical surfaces; the word-line spacers being partially etched-back and having raised upper, outer sidewall portions extending above the inchoate split-gate flash memory structure (12).

34. The structure of claim 33, wherein the word-line spacers (30) are comprised of a conductive material.

35. The structure of claim 33, wherein the word-line spacers (30) are comprised of polysilicon.

36. The structure of claim 33, including an oxide remnant (32) over at least the upper lateral portions of each upper, outer sidewall portion.

37. The structure of claim 33, wherein the word-line spacers (30) each have a width of from about 1700 to 1900 Å.

38. The structure of claim 33, wherein the word-line spacers (30) each have a width of from about 1750 to 1850 Å.

39. The structure of claim 33, wherein the word-line spacers (30) each have a width of about 1800 Å.

* * * * *